(12) United States Patent
Chen et al.

(10) Patent No.: US 10,980,345 B2
(45) Date of Patent: Apr. 20, 2021

(54) BRACKET ASSEMBLY FOR A RACK

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Mei-Zuo Guo, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 137 days.

(21) Appl. No.: 15/893,904

(22) Filed: Feb. 12, 2018

(65) Prior Publication Data

US 2018/0360213 A1     Dec. 20, 2018

(30) Foreign Application Priority Data

Jun. 20, 2017    (TW) ................................ 106120808

(51) Int. Cl.
| | |
|---|---|
| *A47B 88/43* | (2017.01) |
| *H05K 7/14* | (2006.01) |
| *A47B 88/477* | (2017.01) |
| *A47B 96/07* | (2006.01) |

(52) U.S. Cl.
CPC ............ *A47B 88/43* (2017.01); *A47B 88/477* (2017.01); *H05K 7/1489* (2013.01); *A47B 96/07* (2013.01)

(58) Field of Classification Search
CPC ..... A47B 88/43; A47B 88/477; H05K 7/1489
USPC ............................ 248/219.3, 220.21, 220.31
See application file for complete search history.

(56) References Cited

U.S. PATENT DOCUMENTS

| | | | |
|---|---|---|---|
| 6,230,903 B1 * | 5/2001 | Abbott | ................. H05K 7/1421 211/190 |
| 7,350,884 B2 | 4/2008 | Palker et al. | |
| 8,371,454 B2 * | 2/2013 | Chen | .................... H05K 7/1421 211/26 |

(Continued)

FOREIGN PATENT DOCUMENTS

| | | |
|---|---|---|
| EP | 2587905 A2 | 5/2013 |
| JP | 2010062264 A | 3/2010 |
| JP | 2017070704 A | 4/2017 |

OTHER PUBLICATIONS

Foreign Patent Search Document Issued by a Foreign Patent Office for 18158517.5-1011 dated Apr. 5, 2018.

(Continued)

*Primary Examiner* — Kimberly T Wood
(74) *Attorney, Agent, or Firm* — Rosenberg, Klein & Lee

(57) ABSTRACT

A bracket assembly includes a first bracket and a second bracket. The first bracket includes a first support segment, a second support segment, and a third support segment. The first support segment has an upper portion and a lower portion. The second support segment extends in a first direction from the upper portion of the first support segment. The third support segment extends in the first direction from a portion of the first support segment that is adjacent to the lower portion of the first support segment. The first to the third support segments jointly define a support passage. The first bracket is used to support an object. The second bracket is mounted in the support passage of the first bracket.

21 Claims, 8 Drawing Sheets

(56) References Cited

U.S. PATENT DOCUMENTS

| | | | | |
|---|---|---|---|---|
| 9,116,625 | B2* | 8/2015 | Palmer | G06F 3/0619 |
| 9,144,173 | B2* | 9/2015 | Chen | H05K 7/1489 |
| 9,328,769 | B1* | 5/2016 | Chen | H05K 7/1489 |
| 2001/0040142 | A1* | 11/2001 | Haney | H05K 7/1421 |
| | | | | 211/183 |
| 2002/0084734 | A1 | 7/2002 | Shih | |
| 2002/0158556 | A1* | 10/2002 | Cheng | G11B 33/128 |
| | | | | 312/333 |
| 2009/0101603 | A1 | 4/2009 | Hilburn et al. | |
| 2009/0166485 | A1* | 7/2009 | Chen | A47B 88/43 |
| | | | | 248/200 |
| 2009/0283652 | A1* | 11/2009 | Chen | H05K 7/1489 |
| | | | | 248/298.1 |
| 2014/0217049 | A1* | 8/2014 | Chen | H05K 7/1489 |
| | | | | 211/195 |
| 2015/0201754 | A1* | 7/2015 | Chen | A47B 96/025 |
| | | | | 248/219.3 |
| 2018/0271275 | A1* | 9/2018 | Chen | A47B 88/43 |

OTHER PUBLICATIONS

Foreign Patent Search Document Issued by a Foreign Patent Office for 18158517.5-1011 dated Oct. 22, 2018.

* cited by examiner

BRACKET ASSEMBLY FOR A RACK

FIELD OF THE INVENTION

The present invention relates to a bracket assembly for a rack. More particularly, the invention relates to a bracket assembly that is adaptable to racks of different depths and can support an object directly.

BACKGROUND OF THE INVENTION

U.S. Pat. No. 6,230,903 discloses a bracket assembly invented by Ryan Abbott, which includes a first mounting bracket 27 and a second mounting bracket 47 as shown in FIG. 2 accompanying the specification of the patent. The first mounting bracket 27 is provided with a plurality of elongated slots 33, and the second mounting bracket 47 is provided with a plurality of elongated slots 53. A plurality of studs 31 are provided on a slide mechanism 21, extend through the elongated slots respectively, and are connected with a plurality of nuts 29 respectively to allow adjustment of the distance between the first mounting bracket 27 and the second mounting bracket 47 and to enable the two mounting brackets 27 and 47 to carry a chassis via the slide mechanism 21.

The foregoing bracket assembly, however, cannot carry a chassis directly, i.e., without the slide mechanism. This constitutes a limitation on the applicability of the bracket assembly where budget is limited or where the server to be mounted via the bracket assembly has special requirements in terms of mounting specifications.

SUMMARY OF THE INVENTION

One objective of the present invention is to provide a bracket assembly for a rack, wherein the bracket assembly is adaptable to racks of different depths and can support an object (e.g., a chassis) directly.

According to one aspect of the invention, a bracket assembly includes a first bracket and a second bracket. The first bracket includes a first support segment, a second support segment, and a third support segment. The first support segment has an upper portion and a lower portion. The second support segment extends in a first direction from the upper portion of the first support segment. The third support segment extends in the first direction from a portion of the first support segment that is adjacent to the lower portion of the first support segment. The first support segment, the second support segment, and the third support segment jointly define a support passage. The second bracket includes a first wall, a second wall, and a third wall. The first, the second, and the third walls correspond to the first, the second, and the third support segments of the first bracket respectively.

Preferably, the first bracket includes a first end portion, wherein the first end portion is provided with a first mounting member.

Preferably, the second bracket is mounted in the support passage of the first bracket and includes a second end portion, wherein the second end portion is provided with a second mounting member.

Preferably, the first support segment of the first bracket extends substantially perpendicularly from the first end portion of the first bracket.

Preferably, the second support segment of the first bracket extends substantially perpendicularly from the upper portion of the first support segment of the first bracket.

Preferably, the bracket assembly further includes a first bent segment extending perpendicularly from the second support segment of the first bracket toward the support passage of the first bracket.

Preferably, the third support segment of the first bracket extends substantially perpendicularly from a portion of the first support segment of the first bracket that is adjacent to the lower portion of the first support segment.

Preferably, the bracket assembly further includes a second bent segment extending perpendicularly from the third support segment of the first bracket toward the support passage of the first bracket.

Preferably, the first bracket includes one such third support segment or a plurality of such third support segments.

Preferably, the bracket assembly further includes a fourth support segment extending in a second direction from a portion of the first support segment of the first bracket that is adjacent to the lower portion of the first support segment.

Preferably, the fourth support segment extends substantially perpendicularly from the portion of the first support segment of the first bracket that is adjacent to the lower portion of the first support segment.

Preferably, the first support segment of the first bracket includes a first feature, and the first wall of the second bracket includes a second feature. The first feature and the second feature are not abutted against each other when the first bracket and the second bracket are extended with respect to each other to a first length. The first feature and the second feature are abutted against each other when the first bracket and the second bracket are extended with respect to each other to a second length.

Preferably, the first feature is one of a projection and an elastic arm, and the second feature is the other one of the projection and the elastic arm.

Preferably, the bracket assembly is adapted for mounting to a rack, in which the first bracket is mountable at a first position on a first side of the rack, and the second bracket is mountable at a second position on the first side of the rack.

DETAILED DESCRIPTION OF THE INVENTION

Figure 1:
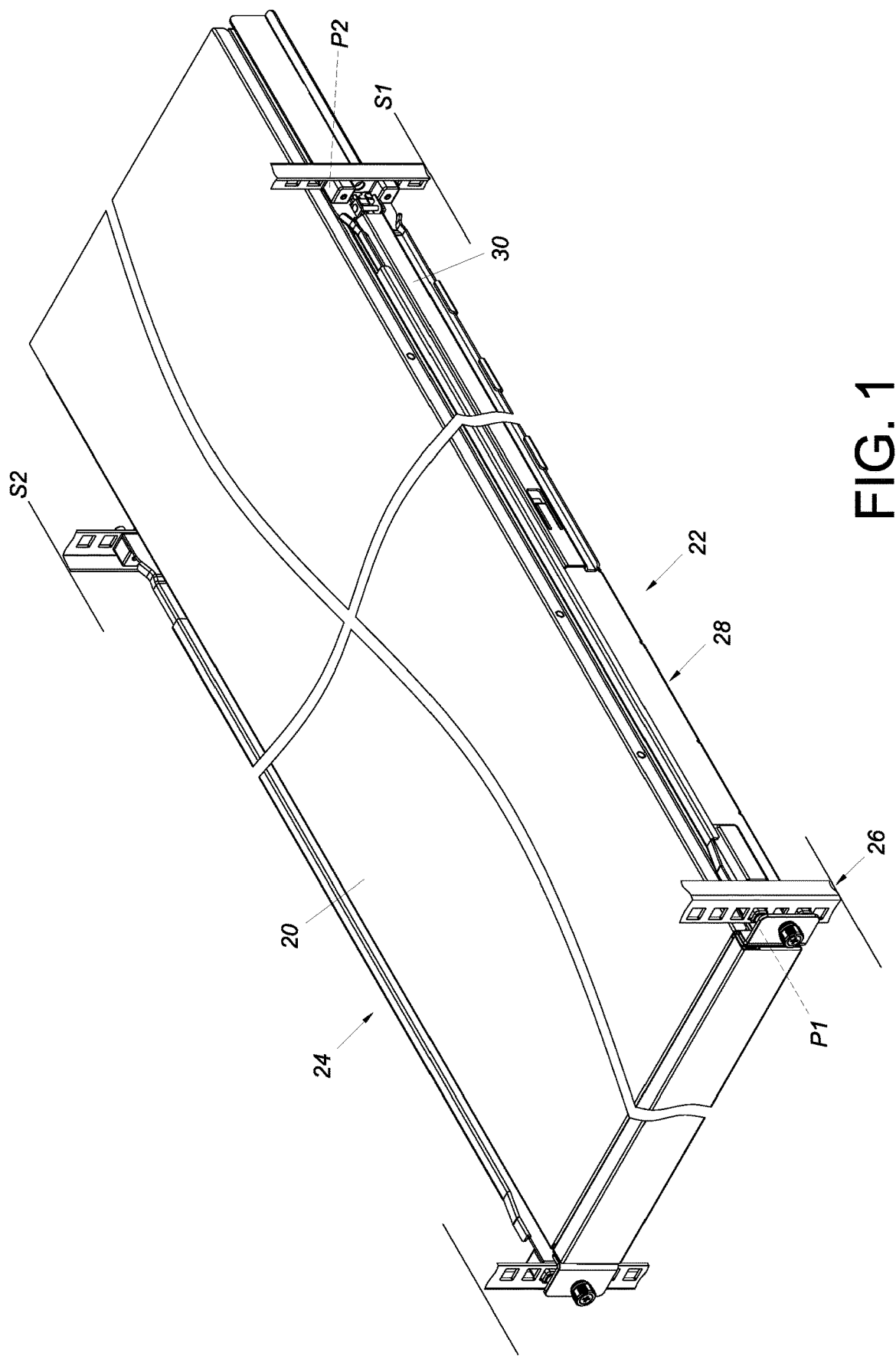
FIG. 1 is a perspective view showing that an object is mounted to a rack via a pair of bracket assemblies in accordance with an embodiment of the present invention.

Referring to FIG. 1, an object 20 is mounted on a rack 26 via a pair of bracket assemblies 22 and 24 in an embodiment of the present invention. More specifically, the object 20 may be the chassis of a piece of electronic equipment, and the bracket assembly 22 includes a first bracket 28 and a second bracket 30. The first bracket 28 is mounted at a first position P1 on a first side S1 of the rack 26. The second bracket 30 is mounted at a second position P2 on the first side S1 of the rack 26. The other bracket assembly 24 is mounted on a second side S2 of the rack 26 in a similar manner.

Figure 2:
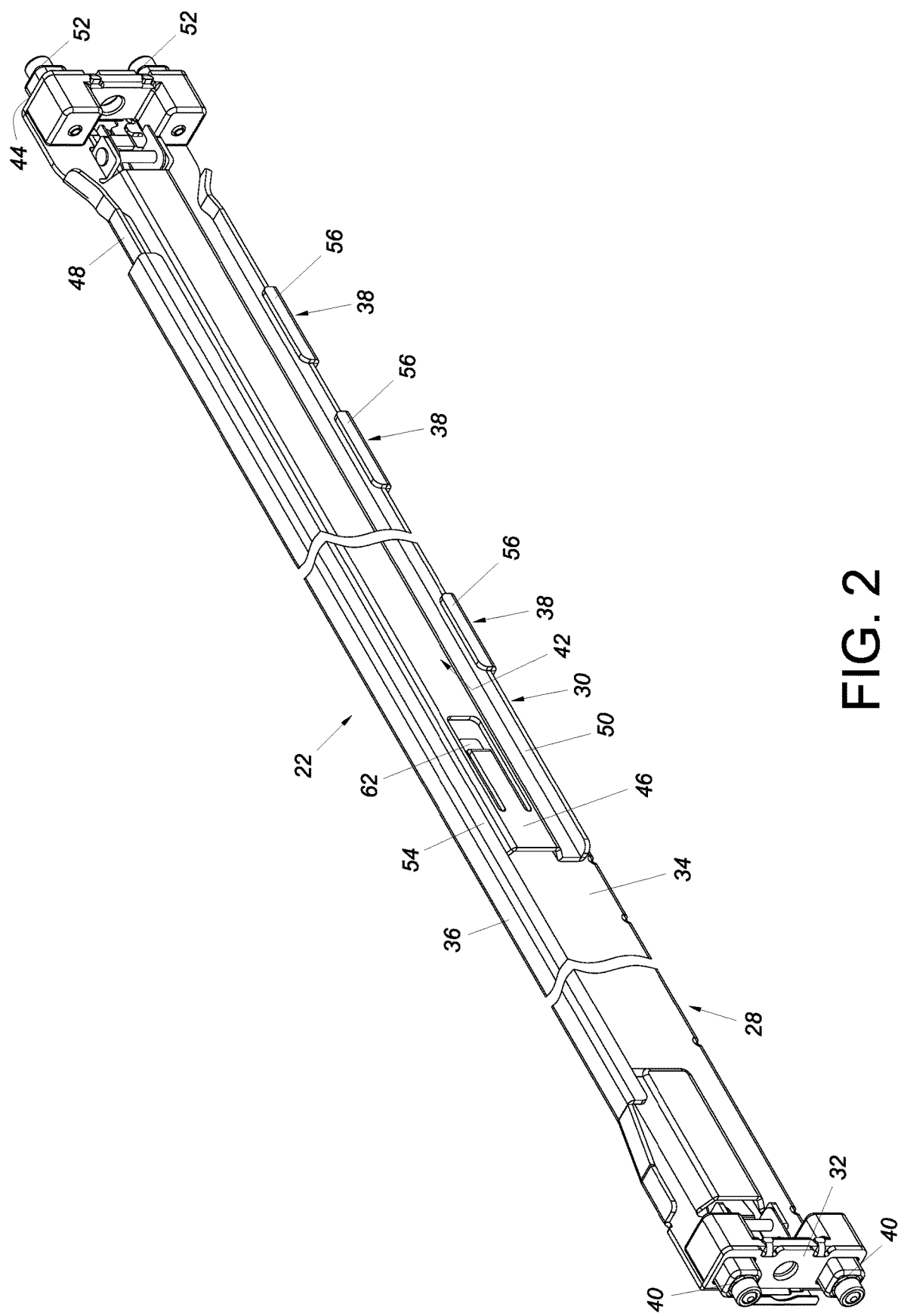
FIG. 2 is a perspective view showing the structure of the bracket assembly in accordance with an embodiment of the present invention.
Figure 3:
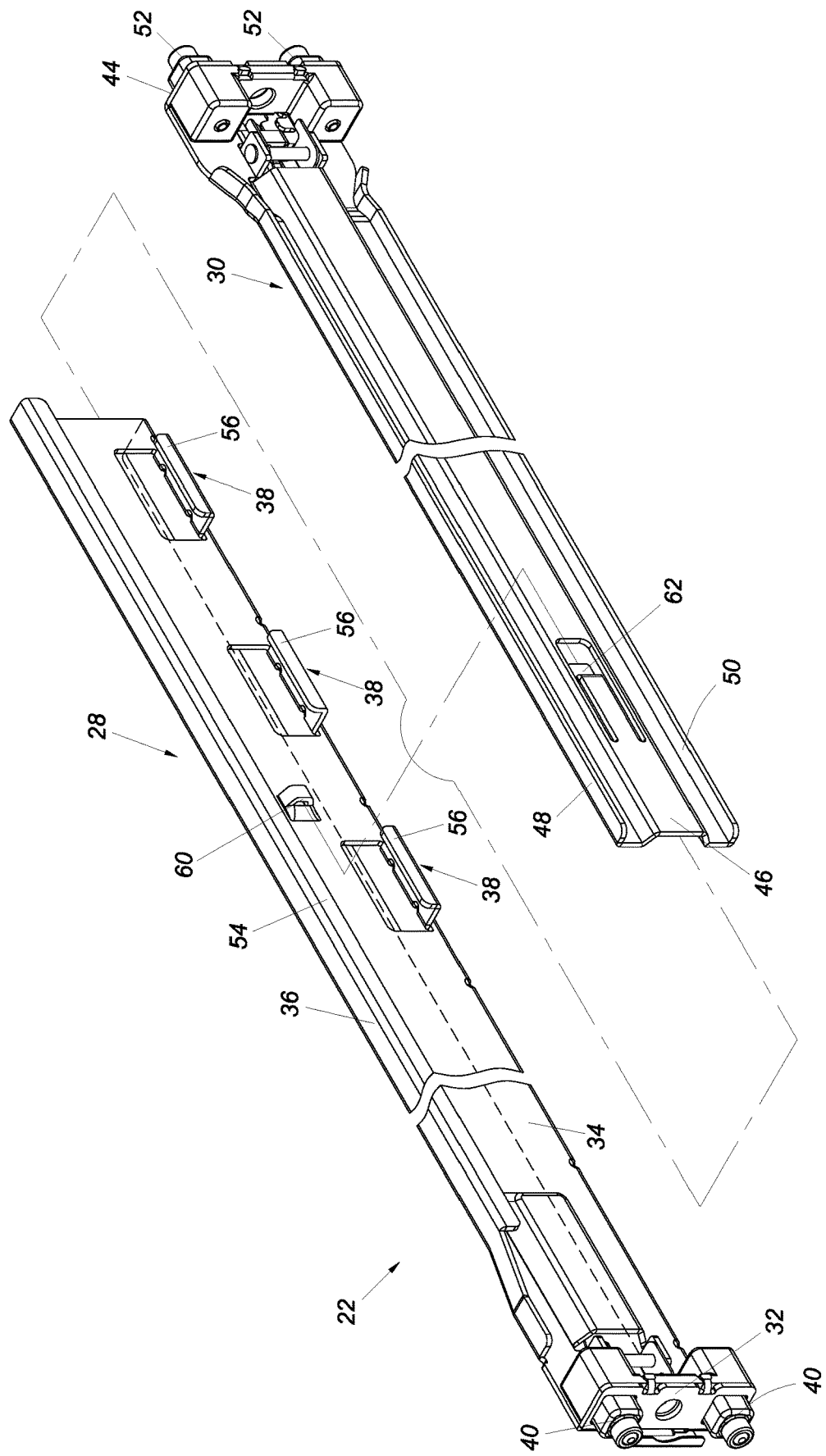
FIG. 3 is an exploded view of the bracket assembly in accordance with an embodiment of the present invention.
Figure 4:
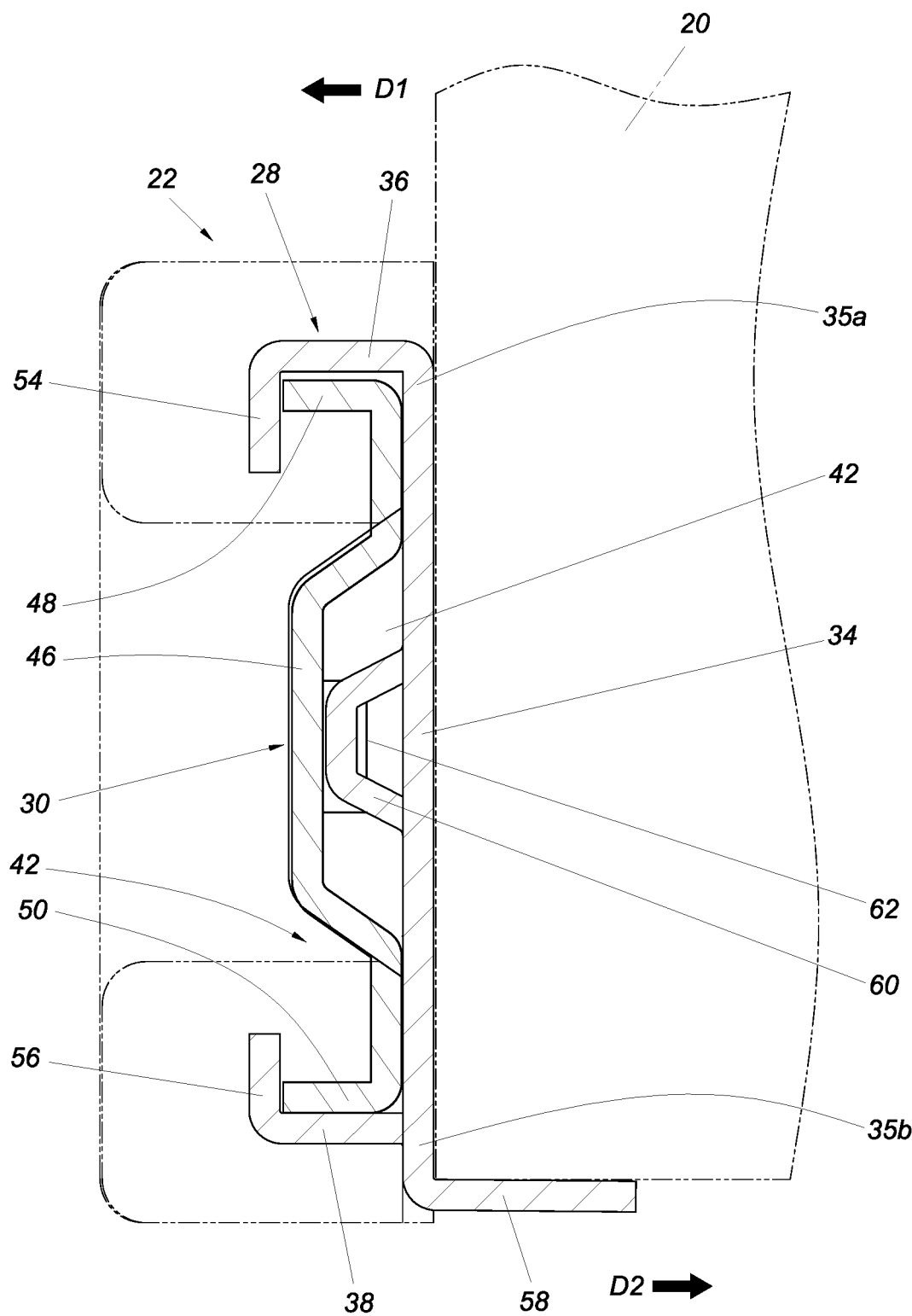
FIG. 4 is a sectional view showing that the bracket assembly in accordance with an embodiment of the present invention supports the object.

FIG. 2 to FIG. 4 further show how the components of the bracket assembly 22 are arranged in relation to one another. The first bracket 28 of the bracket assembly 22 includes a first end portion 32, a first support segment 34, a second support segment 36, and a third support segment 38. The first end portion 32 is provided with at least one first mounting member 40 for mounting the first bracket 28 at the first position P1 on the first side S1 of the rack 26. As shown in FIG. 4, the first support segment 34 has an upper portion 35a and a lower portion 35b, the second support segment 36 extends in a first direction D1 from the upper portion 35a of the first support segment 34, and the third support segment 38 extends in the first direction D1 from a portion of the first support segment 34 that is adjacent to the lower portion 35b. The first support segment 34, the second support segment 36, and the third support segment 38 jointly define a support passage 42.

The second bracket 30 is mounted in the support passage 42 of the first bracket 28. The second bracket 30 includes a second end portion 44, a first wall 46, a second wall 48, and a third wall 50. The second end portion 44 is provided with at least one second mounting member 52 for mounting the second bracket 30 at the second position P2 on the first side S1 of the rack 26. As shown in FIG. 4, the first wall 46 corresponds to the first support segment 34 of the first bracket 28, the second wall 48 corresponds to the second support segment 36 of the first bracket 28, and the third wall 50 corresponds to the third support segment 38 of the first bracket 28.

In a preferred embodiment as shown in FIG. 3, the first support segment 34 of the first bracket 28 extends substantially perpendicularly from the first end portion 32 of the first bracket 28.

In a preferred embodiment as shown in FIG. 4, the second support segment 36 of the first bracket 28 extends substantially perpendicularly from the upper portion 35a of the first support segment 34.

In a preferred embodiment as shown in FIG. 4, a first bent segment 54 is additionally provided. The first bent segment 54 extends perpendicularly from the second support segment 36 of the first bracket 28 toward the support passage 42.

In a preferred embodiment as shown in FIG. 4, the third support segment 38 of the first bracket 28 extends substantially perpendicularly from a portion of the first support segment 34 that is adjacent to the lower portion 35b.

In a preferred embodiment as shown in FIG. 4, a second bent segment 56 is additionally provided. The second bent segment 56 extends perpendicularly from the third support segment 38 of the first bracket 28 toward the support passage 42.

In a preferred embodiment as shown in FIG. 3, the first bracket 28 includes a plurality of separate third support segments 38. In practice, however, a single continuous third support segment 38 works just as well. The present invention has no limitation in this regard.

In a preferred embodiment as shown in FIG. 4, a fourth support segment 58 is additionally provided. The fourth support segment 58 extends in a second direction D2 from a portion of the first support segment 34 of the first bracket 28 that is adjacent to the lower portion 35b.

In a preferred embodiment as shown in FIG. 4, the fourth support segment 58 of the first bracket 28 extends substantially perpendicularly from a portion of the first support segment 34 that is adjacent to the lower portion 35b, and the fourth support segment 58 can be used to support a bottom portion of the object 20 directly, with a lateral side of the object 20 abutted against the first support segment 34 of the first bracket 28.

In a preferred embodiment as shown in FIG. 3, the first support segment 34 of the first bracket 28 includes a first feature 60, and the first wall 46 of the second bracket 30 includes a second feature 62. More specifically, the first feature 60 is a projection, and the second feature 62 is an elastic arm. In an embodiment that is not shown, the first feature 60 is an elastic arm instead while the second feature 62 is a projection. In other words, the first feature 60 is one of a projection and an elastic arm, and the second feature 62 is the other one of the projection and the elastic arm; the present invention has no limitation in this regard. Once the first bracket 28 and the second bracket 30 are connected, the elastic arm moves past the projection elastically.

Figure 5:
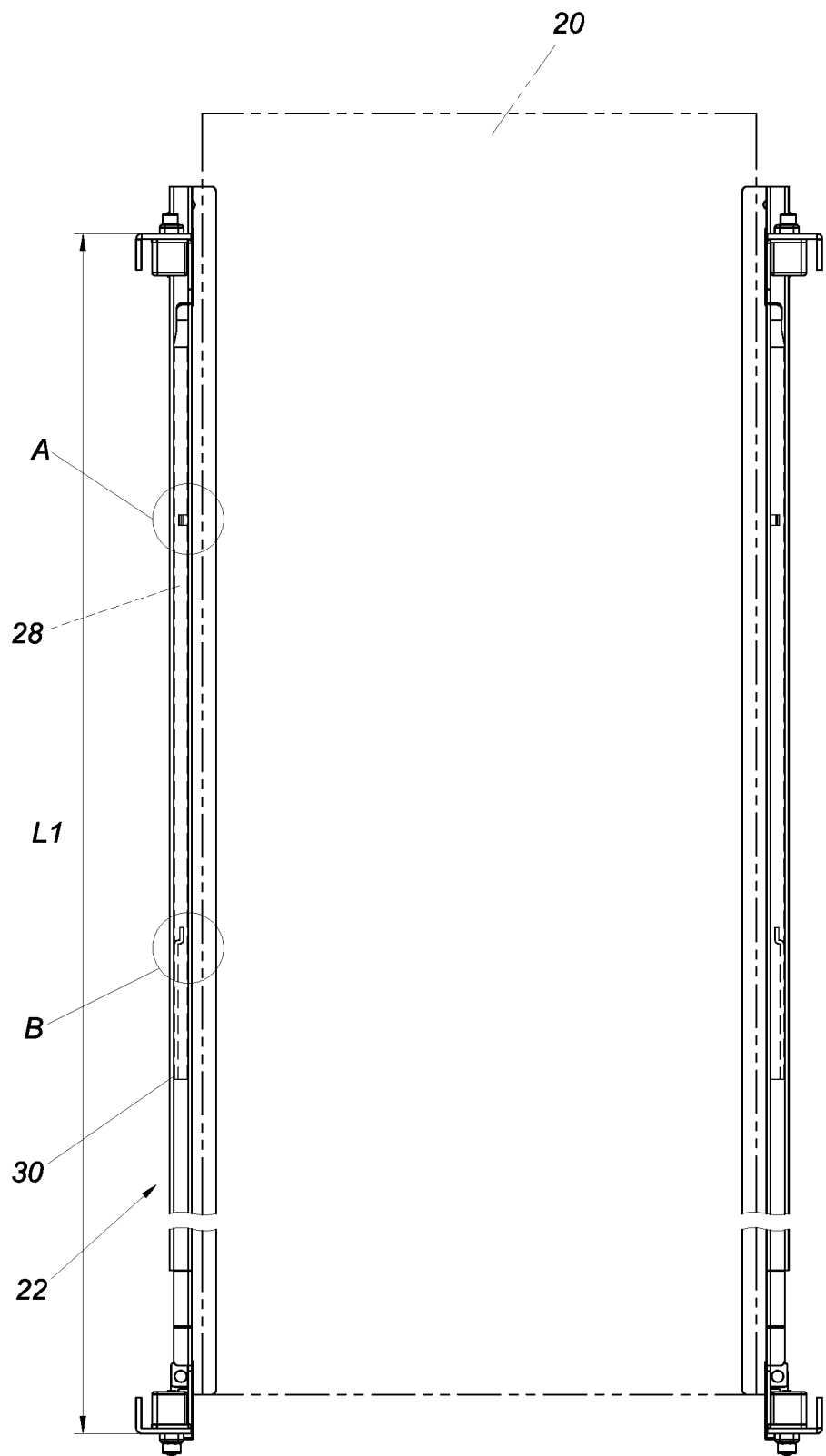
FIG. 5 shows that the bracket assembly in accordance with an embodiment of the present invention is extended to a first length and mounted on a corresponding rack.
Figure 6:
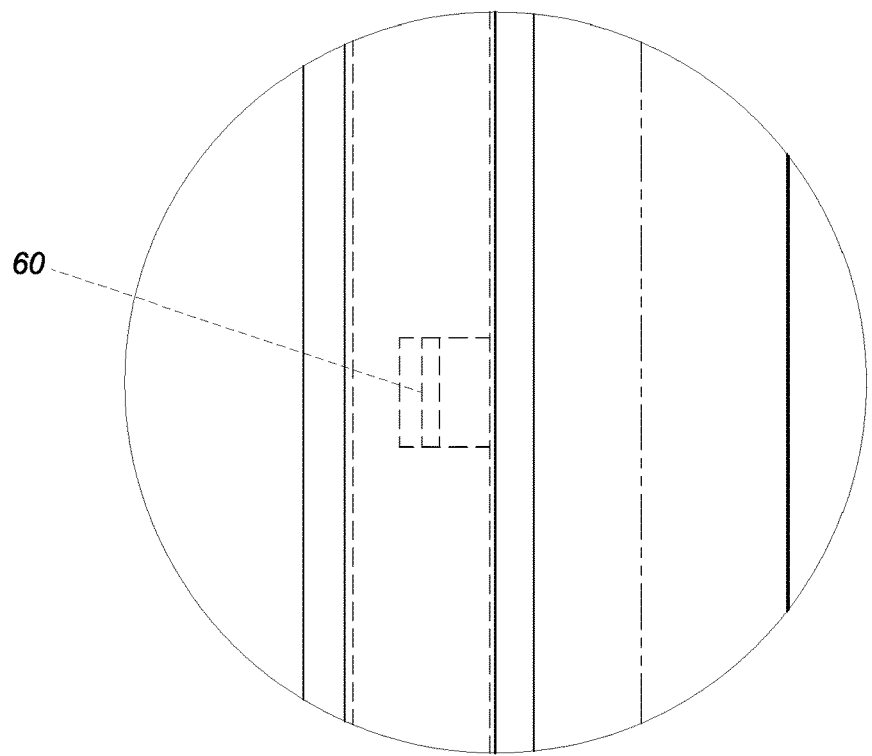
FIG. 6 is an enlarged view of the circled area A in FIG. 5.
Figure 7:
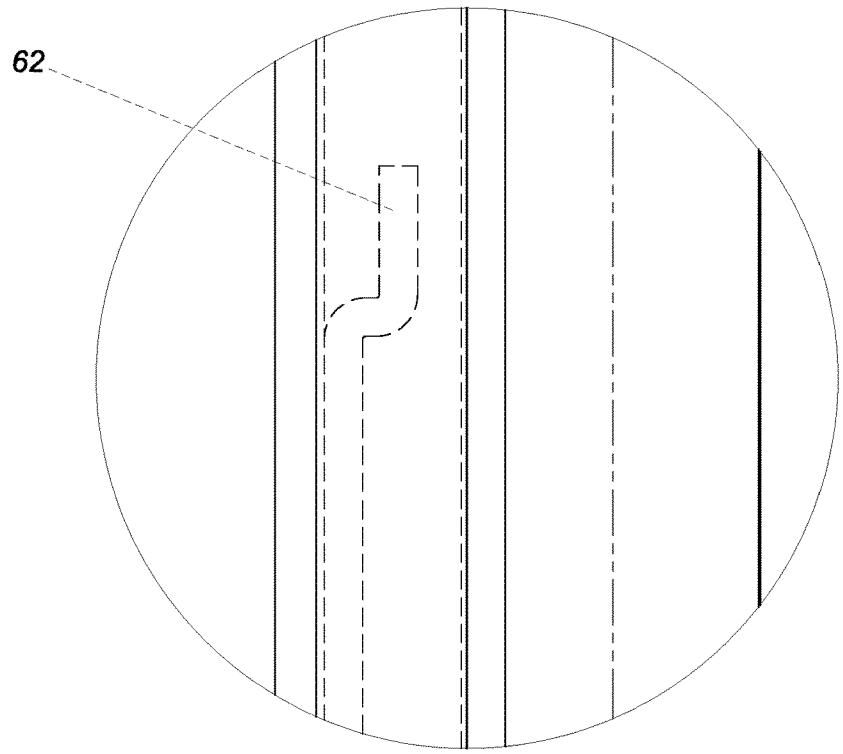
FIG. 7 is an enlarged view of the circled area B in FIG. 5.
Figure 8:
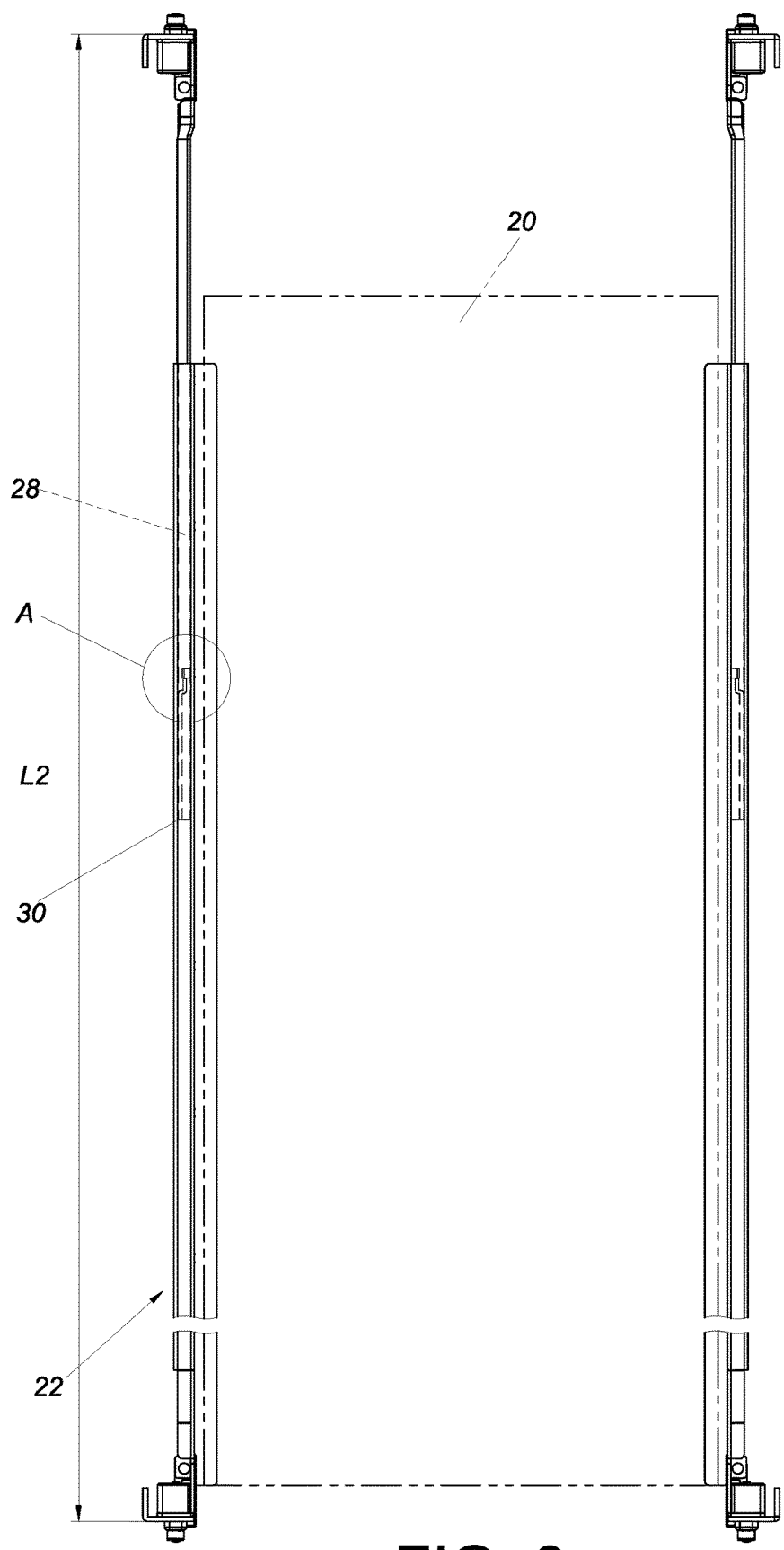
FIG. 8 shows that the bracket assembly in accordance with an embodiment of the present invention is extended to a second length and mounted on a corresponding rack.
Figure 9:
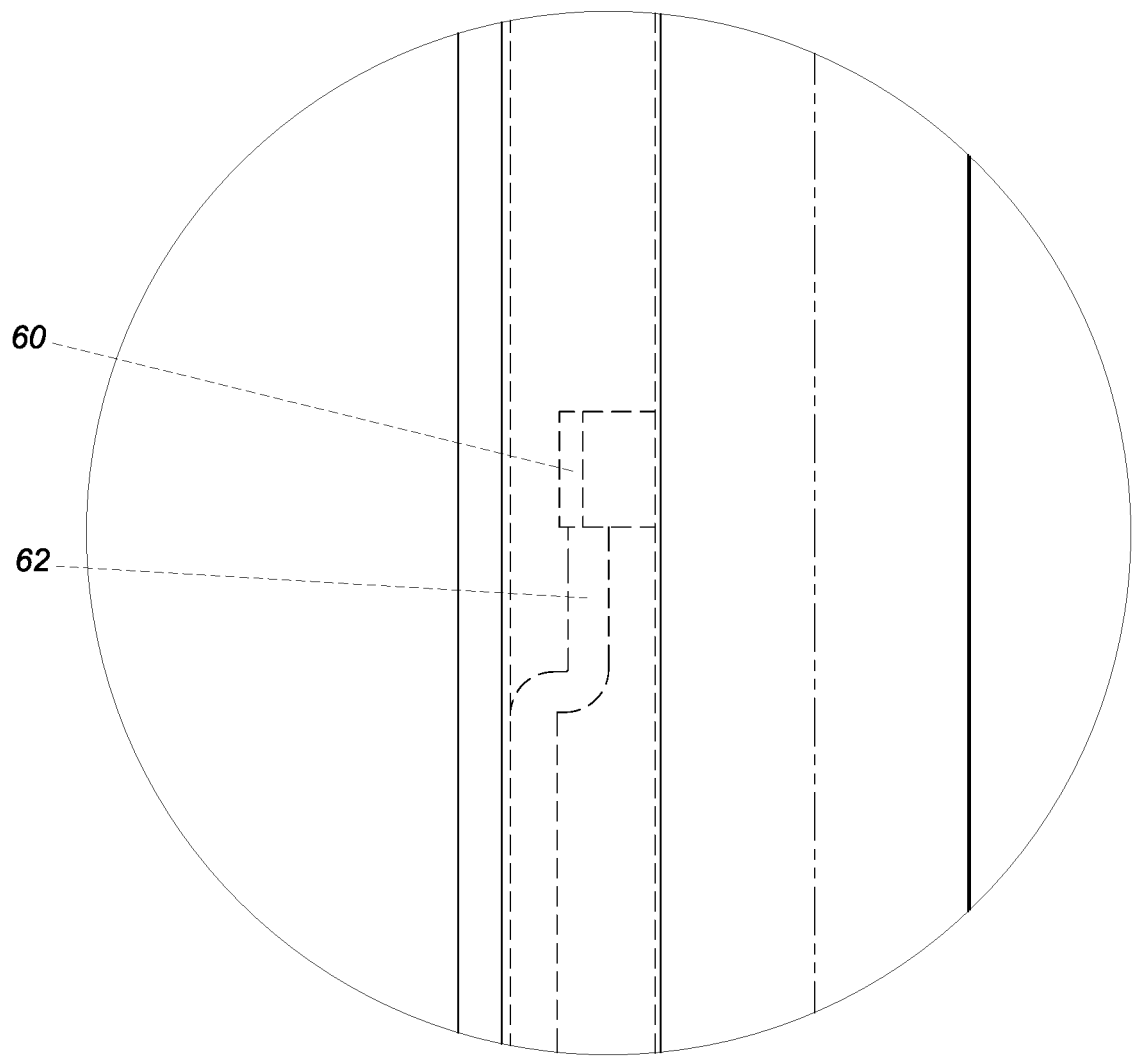
FIG. 9 is an enlarged view of the circled area A in FIG. 8.

When the first bracket 28 and the second bracket 30 are extended with respect to each other to a first length L1 as shown in FIG. 5 to FIG. 7, the first feature 60 and the second feature 62 are not abutted against each other. When the first bracket 28 and the second bracket 30 are extended with respect to each other to a second length L2 as shown in FIG. 8 and FIG. 9, the first feature 60 and the second feature 62 are abutted against each other to set a limit on the relative displacement of (i.e., on the adjustment of distance between) the first bracket 28 and the second bracket 30, with a view to safety.

According to the above, the bracket assemblies in the foregoing embodiments preferably include the following features:

1. Each bracket assembly is adjustable in length to adapt to racks of different depths.
2. The bracket assemblies can be mounted on a rack and support an object directly.

While the present invention has been disclosed by way of the preferred embodiments described above, it should be understood that those embodiments are not intended to be restrictive of the scope of the invention. The scope of patent protection sought by the applicant is defined by the appended claims.

What is claimed is:

1. A bracket assembly for adjustably mounting to a rack and directly supporting equipment for the rack, comprising:
    a first bracket being integrally formed in one-piece formation to include a first support segment, a second support segment, a third support segment, and a fourth support segment, the first bracket having a first end portion, wherein:
        the first end portion is provided with a first mounting member;
        the first support segment extends longitudinally from the first end portion, the first support segment has an upper portion, a lower portion, and an intermediate portion extending in a vertical direction therebetween;
        the second support segment being continuous throughout a length of said second support segment; said second support segment is disposed adjacent the upper portion of the first support segment to extend in a first direction therefrom;

the third support segment is disposed adjacent the lower portion of the first support segment, the third support segment defining a planar surface extending in the first direction therefrom;

the first support segment, the second support segment, and the third support segment jointly define a support passage;

the fourth support segment is disposed adjacent the lower portion of the first support segment to project therefrom in a second direction opposite the first direction to define a supporting surface for the equipment, at least a part of the first support segment having both the third and fourth support segments extending longitudinally therealong at opposite sides thereof, the supporting surface of the fourth support segment being offset in the vertical direction from the planar surface of the third support segment; and the first support segment is configured to maintain vertically unobstructed clearance above the supporting surface of the fourth support segment for the equipment to be supported thereby; and a second bracket mounted in the support passage of the first bracket and including a second end portion, a first wall, a second wall, and a third wall, wherein:

the second end portion is provided with a second mounting member, the first wall corresponds to the first support segment of the first bracket, the second wall corresponds to the second support segment of the first bracket; said second wall extending in the first direction and perpendicular to said first support segment, and the third wall corresponds to the third support segment of the first bracket; said third wall extending in the first direction and perpendicular to said first support segment.

2. The bracket assembly of claim 1, wherein the first support segment of the first bracket extends substantially perpendicularly from the first end portion of the first bracket.

3. The bracket assembly of claim 1, wherein the second support segment of the first bracket extends substantially perpendicularly from the upper portion of the first support segment of the first bracket.

4. The bracket assembly of claim 3, further comprising a first bent segment extending perpendicularly from the second support segment of the first bracket toward the support passage of the first bracket.

5. The bracket assembly of claim 1, wherein the third support segment of the first bracket extends substantially perpendicularly from the first support segment of the first bracket.

6. The bracket assembly of claim 5, further comprising a second bent segment extending perpendicularly from the third support segment of the first bracket toward the support passage of the first bracket.

7. The bracket assembly of claim 6, wherein the first bracket includes one said third support segment or a plurality of said third support segments.

8. The bracket assembly of claim 1, wherein the fourth support segment extends substantially perpendicularly from the first support segment of the first bracket.

9. The bracket assembly of claim 1, wherein the first support segment of the first bracket includes a first feature; the first wall of the second bracket includes a second feature; the first feature and the second feature are not abutted against each other when the first bracket and the second bracket are extended with respect to each other to a first length; and the first feature and the second feature are abutted against each other when the first bracket and the second bracket are extended with respect to each other to a second length.

10. The bracket assembly of claim 9, wherein the first feature is one of a projection and an elastic arm, and the second feature is the other one of the projection and the elastic arm.

11. A bracket assembly adapted to be mounted to a rack and directly support equipment for the rack, the bracket assembly comprising:

a first bracket mountable at a first position on a first side of the rack, the first bracket being integrally formed in one-piece formation to include a first support segment, a second support segment, a third support segment, and a fourth support segment, wherein:

the first support segment extends longitudinally and has an upper portion, a lower portion, and an intermediate portion extending in a vertical direction therebetween each defined therealong;

the second support segment being continuous throughout a length of said second support segment; said second support segment is disposed adjacent the upper portion of the first support segment to extend in a first direction therefrom;

the third support segment is disposed adjacent the lower portion of the first support segment, the third support segment defining a planar surface extending in the first direction therefrom;

the first support segment, the second support segment, and the third support segment jointly define a support passage;

the fourth support segment is disposed adjacent the lower portion of the first support segment to project therefrom in a second direction opposite the first direction to define a supporting surface for the equipment, at least a part of the first support segment having both the third and fourth support segments extending longitudinally therealong at opposite sides thereof, the supporting surface of the fourth support segment being offset in the vertical direction from the planar surface of the third support segment; and the first support segment is configured to maintain vertically unobstructed clearance above the supporting surface of the fourth support segment for the equipment to be supported thereby; and a second bracket mountable at a second position on the first side of the rack and including a first wall, a second wall, and a third wall, wherein:

the first wall corresponds to the first support segment of the first bracket, the second wall corresponds to the second support segment of the first bracket; said second wall extending in the first direction and perpendicular to said first support segment, and the third wall corresponds to the third support segment of the first bracket; said third wall extending in the first direction and perpendicular to said first support segment.

12. The bracket assembly of claim 11, wherein the first bracket includes a first end portion, the first end portion is provided with a first mounting member to be mounted at the first position on the first side of the rack, the second bracket includes a second end portion, and the second end portion is provided with a second mounting member to be mounted at the second position on the first side of the rack.

13. The bracket assembly of claim 12, wherein the first support segment of the first bracket extends substantially perpendicularly from the first end portion of the first bracket.

14. The bracket assembly of claim 11, wherein the second support segment of the first bracket extends substantially perpendicularly from the upper portion of the first support segment of the first bracket.

15. The bracket assembly of claim 14, further comprising a first bent segment extending perpendicularly from the second support segment of the first bracket toward the support passage of the first bracket.

16. The bracket assembly of claim 11, wherein the third support segment of the first bracket extends substantially perpendicularly from the first support segment of the first bracket.

17. The bracket assembly of claim 16, further comprising a second bent segment extending perpendicularly from the third support segment of the first bracket toward the support passage of the first bracket.

18. The bracket assembly of claim 17, wherein the first bracket includes one said third support segment or a plurality of said third support segments.

19. The bracket assembly of claim 11, wherein the fourth support segment of the first bracket extends substantially perpendicularly from the first support segment of the first bracket.

20. The bracket assembly of claim 11, wherein the first support segment of the first bracket includes a first feature; the first wall of the second bracket includes a second feature; the first feature and the second feature are not abutted against each other when the first bracket and the second bracket are extended with respect to each other to a first length; and the first feature and the second feature are abutted against each other when the first bracket and the second bracket are extended with respect to each other to a second length.

21. The bracket assembly of claim 20, wherein the first feature is one of a projection and an elastic arm, and the second feature is the other one of the projection and the elastic arm.

* * * * *